United States Patent [19]

Choi

[11] Patent Number: 5,023,203
[45] Date of Patent: Jun. 11, 1991

[54] METHOD OF PATTERNING FINE LINE WIDTH SEMICONDUCTOR TOPOLOGY USING A SPACER

[75] Inventor: Sangsoo Choi, Chungnam, Rep. of Korea

[73] Assignee: Korea Electronics & Telecommunications Research Institute et al., Seoul, Rep. of Korea

[21] Appl. No.: 370,872

[22] Filed: Jun. 23, 1989

[30] Foreign Application Priority Data

Jul. 28, 1988 [KR] Rep. of Korea .................. 88-9546

[51] Int. Cl.⁵ .................. H01L 21/00; H01L 21/02; H01L 21/302; H01L 21/314
[52] U.S. Cl. .................. 437/228; 437/229; 437/235; 148/DIG. 51; 156/644; 156/659.1; 156/661.1
[58] Field of Search .......... 437/49, 147, 189, 225, 437/228, 229, 235; 148/DIG. 51, DIG. 103, DIG. 106; 156/644, 649, 659.1, 661.1; 357/47, 49, 54, 56

[56] References Cited

U.S. PATENT DOCUMENTS

| | | |
|---|---|---|
| 4,351,894 | 9/1982 | Yonezawa et al. ............ 437/147 |
| 4,373,965 | 2/1983 | Smigelski ..................... 437/147 |
| 4,412,378 | 11/1983 | Shinada ....................... 437/147 |
| 4,432,132 | 2/1984 | Kinsbron et al. .............. 437/178 |
| 4,455,742 | 6/1984 | Williams et al. .............. 437/147 |

FOREIGN PATENT DOCUMENTS

| | | | |
|---|---|---|---|
| 0150970 | 11/1979 | Japan | 437/147 |
| 0035421 | 4/1981 | Japan | 437/147 |
| 0045227 | 3/1982 | Japan | 437/147 |

Primary Examiner—Brian E. Hearn
Assistant Examiner—B. Everhart
Attorney, Agent, or Firm—Evenson, Wands, Edwards, Lenahan & McKeown

[57] ABSTRACT

A method for reducing the line widths produced by patterning a semiconductor substrate with a multilayer resist mask employs a 'spacer'-forming oxide layer which is non-selectively formed over the mask structure after an aperture for exposing a lower resist layer has been formed in an upper portion of the multilayer mask, but prior to etching a lower resist layer. The oxide layer is subjected to a dry systemic etch to vertically remove material of the oxide layer down to the surface of the lower resist layer. Because of the substantial step coverage of the oxide layer, a 'spacer' or 'stringer' portion remains along the sidewalls of the original aperture in the upper portion of the mask, whereby the dimensions of the exposure window are reduced. Retaining this sidewall spacer as an integral part of mask structure permits narrower line widths to be replicated in the underlying substrate.

3 Claims, 5 Drawing Sheets

FIG. 5(G)

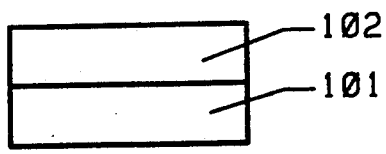
FIG. 4(A)
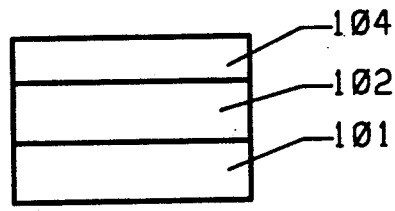
FIG. 4(B)
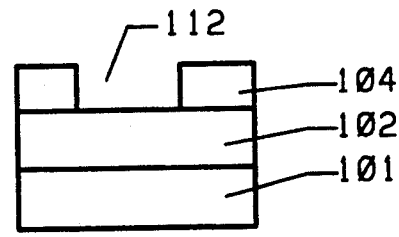
FIG. 4(C)
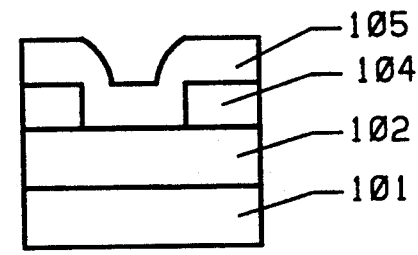
FIG. 4(D)
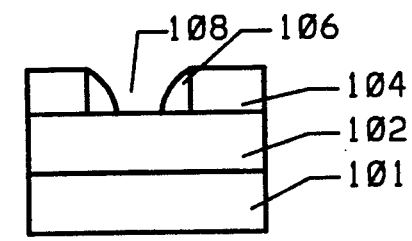
FIG. 4(E)
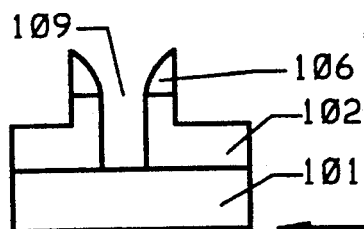
FIG. 4(F)
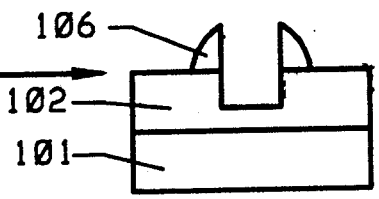
FIG. 4(F')
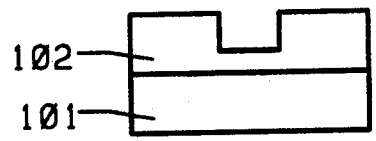
FIG. 4(G')
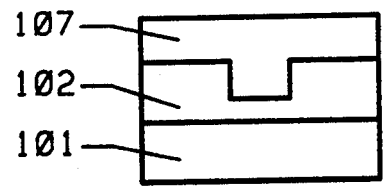
FIG. 4(H')
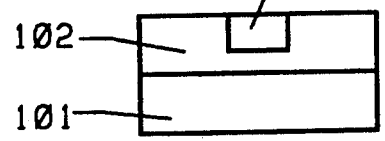
FIG. 4(I')
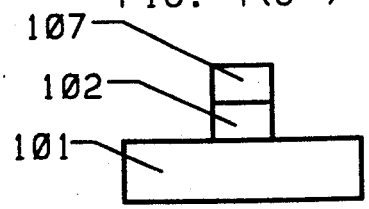
FIG. 4(J')

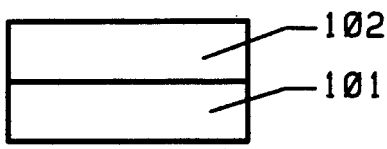
FIG. 5(A)
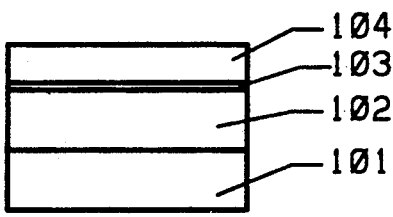
FIG. 5(B)
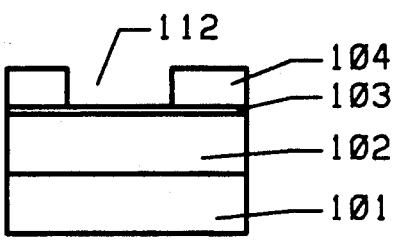
FIG. 5(C)
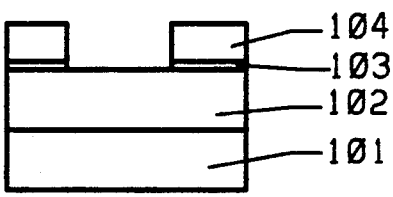
FIG. 5(D)
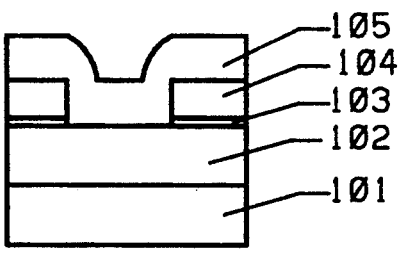
FIG. 5(E)
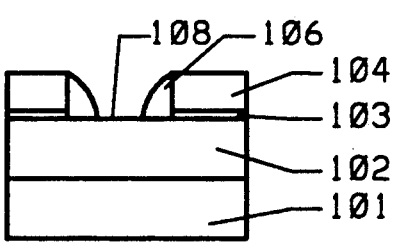
FIG. 5(F)
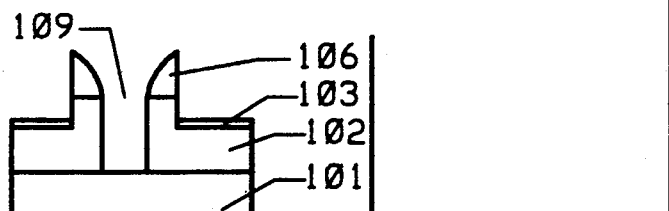
FIG. 5(G)
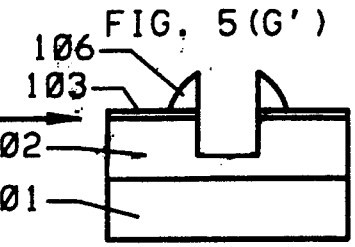
FIG. 5(G')
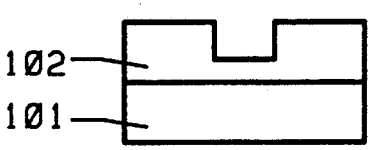
FIG. 5(H')
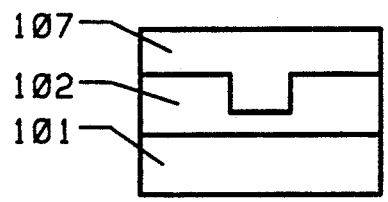
FIG. 5(I')
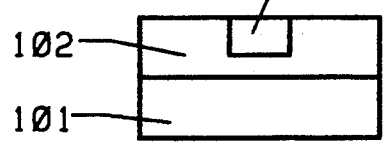
FIG. 5(J')
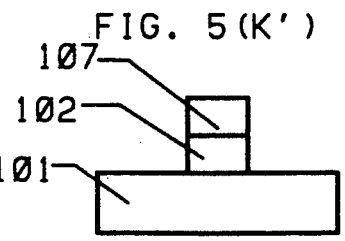
FIG. 5(K')

METHOD OF PATTERNING FINE LINE WIDTH SEMICONDUCTOR TOPOLOGY USING A SPACER

FIELD OF THE INVENTION

The present invention relates in general to the manufacture of semiconductor devices and is particularly directed to a process for selectively patterning a semiconductor structure through the use of a multilayer mask in which an intermediate spacer is formed as part of the mask structure.

BACKGROUND OF THE INVENTION

The continuing objective of increasing the integration density of semiconductor architectures has brought about the need for extremely fine (sub-micron) resolution patterning methodologies through which a semiconductor topology is defined. Because of the presence of anomalies during the patterning process employing conventional mask configurations, current photolithographic techniques are able to achieve line widths on the order of 0.8 um.

More particularly, FIGS. 1(A)–(C) diagrammatically illustrate the photolithographic patterning of a single resist masking layer 104 atop a semiconductor substrate 101, using an overlying photomask 110 having an aperture 112 through which the photoresist layer 104 is exposed to a source of ultraviolet light 114. After development a corresponding aperture 116 extends through layer 104 so as to expose a selected portion of the surface of the substrate. Although diagrammatically illustrated in FIGS. 1(A)–(C) as having a generally planar surface, in reality it can be expected that the top surface of substrate 101 will contain an undulating or 'stepped' surface, as shown at 120 in FIGS. 1(D)–(F). When such a step is located within the confines of a photomask window, as diagrammatically shown in FIG. 1(E), it may introduce an inaccuracy in the dimensions of the exposed region, as illustrated in FIG. 1(F).

Where the etching mask comprises a multilayer configuration, such as the conventional bilevel and trilevel structures of FIGS. 2(A)–2(D) and FIGS. 3(A)–3(D), respectively, additional processing problems are present. For example, in a bilevel structure, photoresist layer 104 becomes an 'upper' resist layer that is formed on a 'lower' photoresist layer 102, atop an underlying substrate. During the formation of such a mask, it is not uncommon for there to be an intermixing of or chemical reaction between the two photoresist layers, which causes an unwanted residue layer to remain after development of the lower photoresist layer. (The upper photoresist layer 104 is first exposed and developed to form an aperture 112 through which lower photoresist layer 102 is exposed and thereafter developed to expose a selected portion of the surface of substrate 101.)

To circumvent this intermixing problem, the bilevel mask configuration may be augmented by the provision of an intermediate oxide layer 103, thus forming a trilevel structure. Specifically, as illustrated in FIGS. 3(A)–3(D) an intermediate oxide layer 103 may be vapor-deposited between the lower photoresist layer 102 and upper photoresist layer 104. In the course of selectively exposing the surface of the underlying substrate, the aperture 112 through upper resist layer 104 is used to etch the exposed oxide layer 103, after which lower resist layer 102 is exposed (through the patterned oxide layer 103) and developed to complete the trilevel mask fabrication process. Because upper photoresist layer 104 is not formed directly on lower resist layer 102, intermixing of these two resist layers is prevented. However, the use of the additional intermediate oxide layer adds complexity to the bilevel process, without effectively improving upon line width resolution.

SUMMARY OF THE INVENTION

In accordance with the present invention, the line width limitations of conventional single or multilayer semiconductor patterning mask structures, such as those described above, are substantially obviated by a new and improved process that is applicable to both bilevel and trilevel masking methodologies and serves to substantially improve the line width resolution previously obtained. To this end the present invention employs a 'spacer'-froming dielectric (oxide) layer which is non-selectively formed over a multilayer mask structure after an aperture for exposing the lower resist layer has been formed in an upper portion of the mask structure, but prior to etching the lower resist layer. The oxide layer is then subjected to a dry systemic etch (e.g. plasma or reactive ion etch) to vertically remove material of the oxide layer down to the surface of the lower resist layer. Because of the substantial step coverage of the oxide layer, a 'spacer' or 'stringer' portion remains along the sidewalls of the original aperture in the upper portion of the mask structure, whereby the dimensions of the exposure window are reduced or narrowed. Retaining this sidewall spacer as an integral part of mask structure now permits narrower line widths to be replicated in the underlying substrate. Even when using a conventional ultraviolet radiation source (e.g. one having a wavelength of 436 nm), it is possible to pattern the underlying substrate with line widths less than 0.7 um.

BRIEF DESCRIPTION OF THE DRAWINGS

FIGS. 4(A)–4(J') diagrammatically show respective stages of manufacture of a bilevel mask structure in accordance with a first embodiment of the process of the present invention; and FIGS. 5(A)–5(K') illustrate successive stages of manufacture of a trilevel mask in accordance with a second embodiment of the process in accordance with the present invention.

DETAILED DESCRIPTION

Figure 1A:
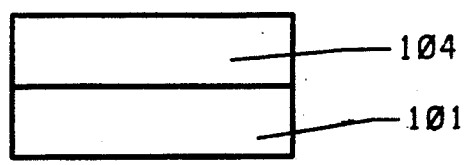
FIGS. 1(A)–(F) diagrammatically illustrate conventional photolithographic patterning of a single resist masking layer atop a semiconductor substrate.
Figure 1B:
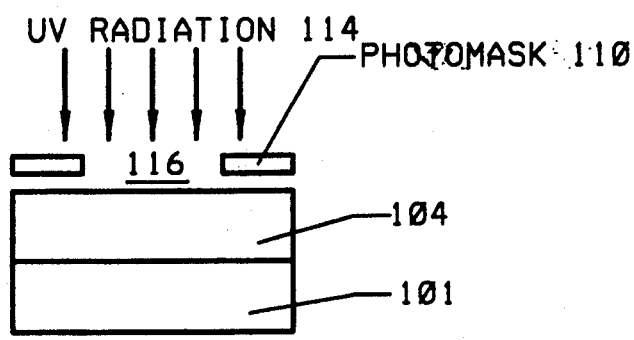
Figure 1C:
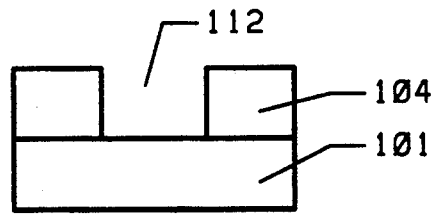
Figure 1D:
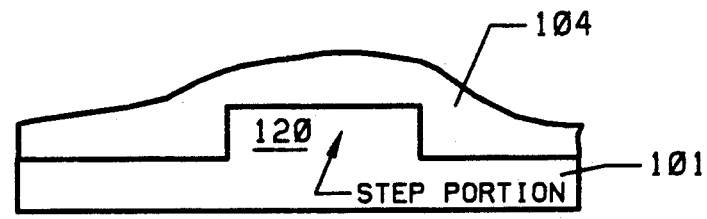
Figure 1E:
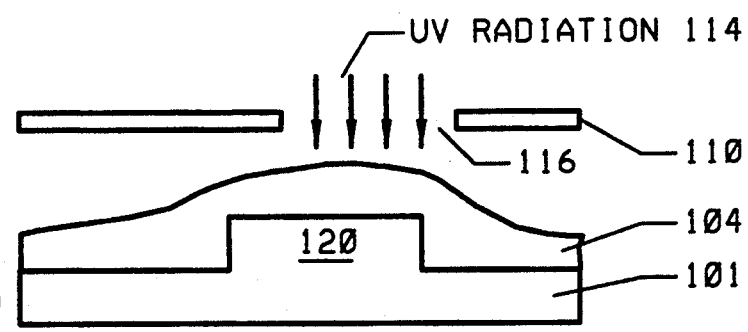
Figure 1F:
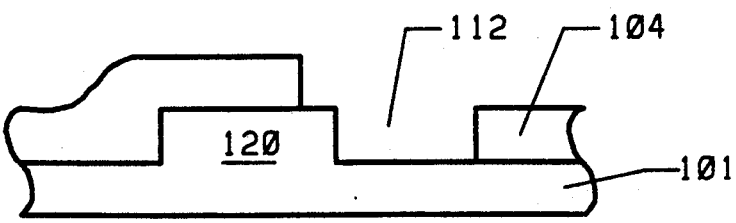
Figure 2A:
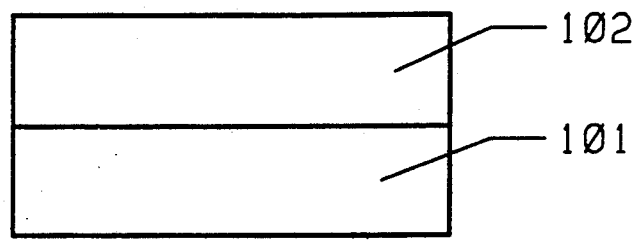
FIGS. 2(A)–2(D) and FIGS. 3(A)–3(D), respectively, illustrate conventional patterning sequences for bilevel and trilevel masking structures formed on a semiconductor substrate.
Figure 2B:
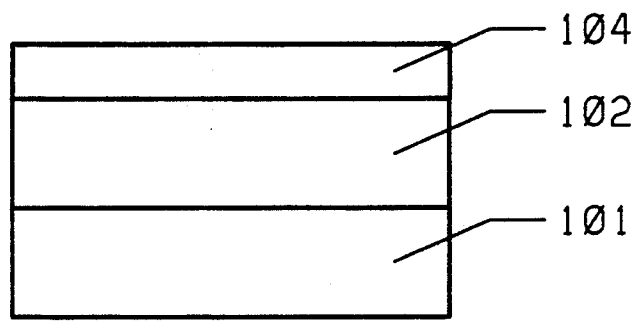
Figure 2C:
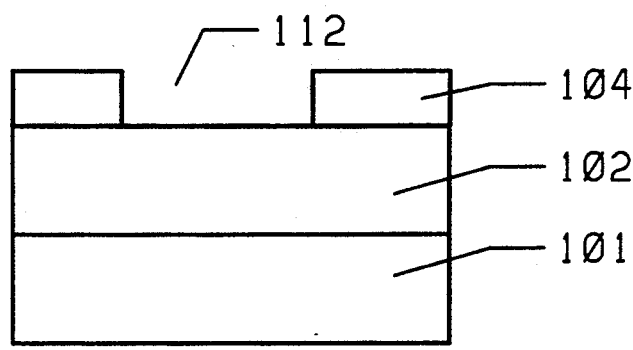
Figure 2D:
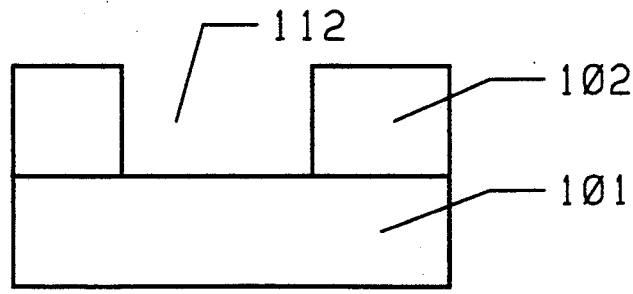
Figure 3A:
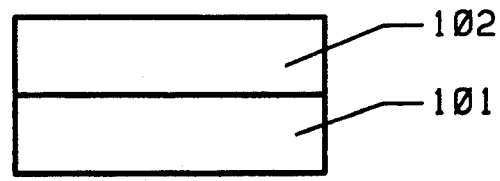
Figure 3B:
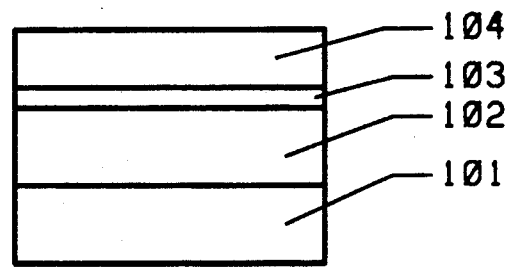
Figure 3C:
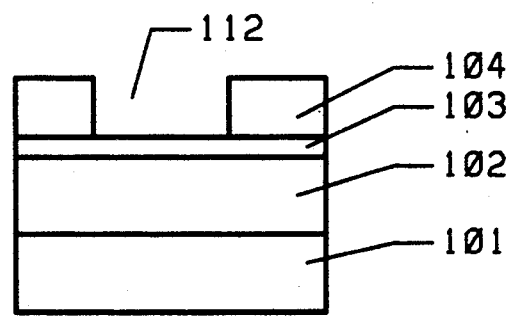
Figure 3D:
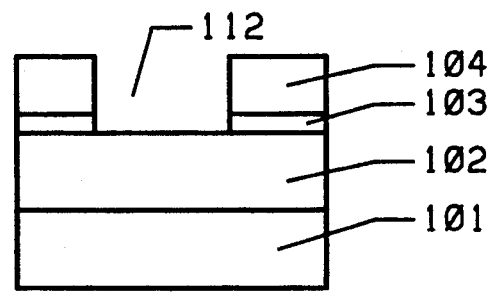
Figure 3E:
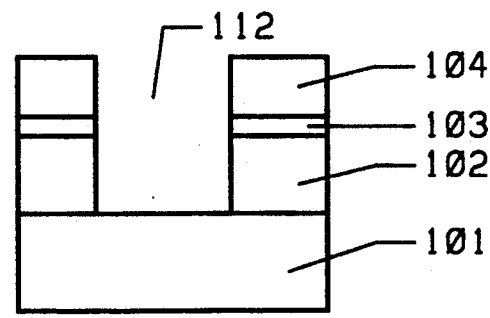

As pointed out previously, the patterning process according to the present invention substantially improves line width resolution by employing a 'spacer'-forming dielectric (e.g. oxide) layer, which is non-selectively formed over the mask structure after an aperture for exposing a lower resist layer has been formed in an upper portion of the multilayer mask structure, but prior to etching the lower resist layer. The dielectric layer is then subjected to a dry systemic etch (e.g. plasma or reactive ion etch) to vertically remove material of that layer down to the surface of the lower resist layer. Because of the substantial step coverage of the dielectric layer, a 'spacer' or 'stringer' portion remains along the sidewalls of the original aperture in the upper portion of the mask structure, whereby the dimensions of the exposure window are reduced. Retaining this sidewall spacer as an integral part of mask structure permits narrower line widths to be replicated in the underlying substrate.

EXAMPLE 1

A first embodiment of the process in accordance with the present invention, for use with a bilevel masking structure, may be understood with reference to FIGS. 4(A)-4(J'), which diagrammatically show respective stage of manufacture of the mask structure for positive and negative patterns. More particularly, FIG. 4(A) shows a first step in the process in which a (photo) resist layer 102 is formed atop an underlying base substrate 101 on which the reduced line width masking pattern is to be formed. For purposes of description of an exemplary embodiment, substrate 101 may comprise a silicon substrate on the top surface of which a first or 'lower' resist layer 102 is spin-coated, for example, by using a conventional rotary coating apparatus at 3000 rpm to a thickness on the order of 1.5 um. Resist layer 102 is then allowed to dry in a convection oven for 21 minutes at a temperature on the order of 200° C. or more. Where the top surface of underlying substrate 101 is substantially planar or effectively 'step-free', resist layer 102 may be hardened in a dry etch systemic system under the condition of $C_2CLF_5$: 50 sccm, 550 mTorr for one minute.

Following the formation of a first or lower resist layer 102, a second or upper resist layer 104 is formed atop resist layer 102, as diagrammatically illustrated in FIG. 4(B). For this purpose, liquid resist material may be spin-coated on layer 102 to a thickness of 4000-5000 angstroms, using a spin coating apparatus operating at a rotational speed of 5000-6000 rpm. Upper resist layer is then subjected to a soft bake at 90° C., plus or minus 3° C. for five minutes.

Next, as shown in FIG. 4(C), a patterning image is developed in upper resist layer forming an aperture 112 through layer 104 to the surface of lower resist layer 102. This image development step may be carried out by exposing upper resist layer 104 to a prescribed image pattern and then, using a X5 stepper, developing resist layer 104 with a wet etch system, using a developing liquid mixed with deionized water and MF-312 at a ratio of 1.5:1.

Following the upper resist development step, a dielectric (e.g. oxide) layer 105 is non-selectively vapor-deposited over upper resist layer 104 to a thickness on the order of 4000 angstroms, at room temperature, using plasma enhanced chemical vapor deposition, as illustrated in FIG. 4(D). Oxide layer 105 is then etched in a dry etch system under systemic conditions of $C_2F_6/CHF_3/He=50/100/50$ sccm, 550 mTorr and 1675 W, so as to etch oxide layer 105 down to the top surface of upper resist layer 102 and to expose the surface of lower resist layer 102 within aperture 112, leaving 'spacer' or 'stringer' material 106 along the sidewalls of aperture 112, as shown in FIG. 4E. The width of this 'spacer' oxide adjacent to the sidewalls of aperture 112 within upper resist layer 104 narrows the size of the exposed surface region 108 of lower resist layer 102 to less than that of the original image pattern. For a negative pattern process, lower resist layer 102 is developed using the 'spacer'-modified mask structure of FIG. 4(E). For this purpose, a dry etch system is used to etch lower resist layer 102 at dry etch conditions of $O_2$: 50 sccm, 350 mTorr and 1675 W, thereby obtaining the mask structure shown in FIG. 4(F), having narrowed aperture 109.

When a positive pattern process is to be carried out, (in which the mask image pattern in upper resist layer 104 is reversed, so that the orientation of 'spacers' 106 is complementary to that shown in FIG. 4(E)), a dry etch system development through the thickness of upper resist layer 104 is carried out under the conditions of $O_2$: 50 sccm, 30 mTorr and 1675 W, thereby obtaining the mask structure shown in FIG. 4(F'). Spacer 106 may then be removed using a room-temperature solution of BHF (7:1) and $HF:NH_4(F, 7:1)$, to leave the mask structure configuration shown in FIG. 4(G').

Next, as diagrammatically depicted in FIG. 4(H'), a filler overlay layer, such as spun-on-glass (SOG), 107 is non-selectively deposited over upper resist layer 104. Where layer 107 is an SOG layer it may be spin-deposited to a thickness on the order of 1 um. Alternatively, layer 107 may comprise a silicon or metallic layer vapor deposited to a thickness on the order of 1 um at a temperature of 200° C. Layer 107 is then planarized by an etch down to the surface of lower resist layer 102, as shown in FIG. 4(I'). For this purpose, layer 107 may be etched in a dry etch apparatus under the conditions of $C_2F_6/CHF_3/He=50/100/50$ sccm, 550 mTorr and 1675 W.

After planarizing filler layer 107 to the level of lower resist layer 102, a positive patterning process may be carried out so that lower resist layer 102 is developed in a dry etch system under the conditions of $O_2$: 50 sccm, 350 mTorr and 1675 W, thereby leaving the positive pattern mask structure illustrated in FIG. 4(J').

EXAMPLE 2

FIGS. 5(A)-5(K') illustrate successive stages of manufacture of a trilevel mask in accordance with a second embodiment of the process in accordance with the present invention, for positive and negative patterns. As in the first embodiment, FIG. 5(A) shows a first step in the process, in which a 1 um thick resist layer 102 is spin-coated atop an underlying (silicon) substrate 101 and then dried in a convection oven for 21 minutes at a temperature on the order of 200° C. or more. Again, where the top surface of underlying substrate 101 is effectively 'step-free', resist layer 102 may be hardened in a dry etch systemic system under the condition of $C_2CLF_5$: 50 sccm, 550 mTorr for one minute.

Following the formation of lower resist layer 102 on substrate 101, a second or intermediate dielectric (e.g. oxide) layer 103 is deposited atop resist layer 102, as diagrammatically illustrate in FIG. 5(B). Oxide layer 103 may be vapor deposited at room temperature using a plasma enhanced chemical vapor deposition process to a thickness on the order of 1000 angstroms atop lower resist layer 102, followed by spin-coating a third or upper resist layer 104 on oxide layer to a thickness of 4000-5000 angstroms, using the previously mentioned spin coating process described in connection with the bilevel embodiment. Thereafter, upper resist layer is subjected to a soft bake.

Next, as shown in FIG. 5(C), a patterning image is developed in upper resist layer 104 forming an aperture 112 through layer 104 to the surface of intermediate oxide layer 103, as described above with respect to the bilevel embodiment. After upper resist layer 104 has been developed, intermediate oxide layer 103 is etched in a dry etch system under the conditions:

$C_2F_6/CHF_3/He = 50/100/50$ sccm, 550 mTorr and 1675 W to yield the structure shown in FIG. 5(D).

Following the extension of aperture 112 through intermediate oxide layer 103, a dielectric (e.g. oxide) layer 105 is non-selectively vapor deposited (FIG. 5(E)) and then etched (FIG. 5(F)), as described above for the bilevel embodiment, to form 'spacers' or 'stringers' that reduce the exposed surface region 108 of lower resist layer 102. As in the bilevel embodiment, for a negative pattern process, lower resist layer 102 is developed using the 'spacer'-modified mask structure of FIG. 5(F), thereby producing the mask structure shown in FIG. 5(G), having narrowed aperture 109. Similarly, When a positive pattern process is to be carried out, the sequence proceeds in the same manner for the bilevel process, as illustrated in FIGS. 5(G')–5(K'), (with intermediate oxide layer 103 being removed together with spacers 106 as shown in FIG. 5(H')).

As will be appreciated from the foregoing description, line width limitations of conventional single or multilayer semiconductor patterning mask structures are substantially reduced by the process according to the present invention that is applicable to both bilevel and trilevel masking methodologies and serves to substantially improve the line width resolution previously obtained. By employing a 'spacer'-forming dielectric layer between the lower and upper resist layers, not only is intermixing of the resists avoided, but due to presence of the resulting 'spacer' or 'stringer' portion along the sidewalls of the original aperture in the upper portion of the mask structure, the dimensions of the exposure window are reduced. Retaining this sidewall spacer as an integral part of mask structure permits narrower line widths to be replicated in the underlying substrate. Even when using a conventional ultraviolet radiation source (e.g. one having a wavelength of 436 nm), it is possible to pattern the underlying substrate with line widths less than 0.7 um.

While I have shown and described several embodiments in accordance with the present invention, it is to be understood that the same is not limited thereto but is susceptible to numerous changes and modifications as known to a person skilled in the art, and I therefore do not wish to be limited to the details shown and described herein but intend to cover all such changes and modifications as are obvious to one of ordinary skill in the art.

What is claimed:

1. A method of manufacturing a semiconductor device comprising the steps of:
   (a) forming a multilayer mask structure on a semiconductor substrate;
   (b) forming an aperture through a portion of said multilayer mask structure, so as to expose a prescribed region of underlying mask material;
   (c) forming a dielectric spacer along a sidewall portion of the aperture formed in step (b), so as to define a reduced spacing masking window over said underlying mask material; and
   (d) etching that portion of said underlying mask material within said reduced spacing masking window, and wherein
   step (a) comprises forming a bilevel mask structure by forming a first resist layer on said substrate and a second resist layer on said first resist layer, and wherein step (b) comprises forming said aperture through said second resist layer to expose a prescribed region of said first resist layer, and wherein
   step (a) further includes the step of hardening said first resist layer at dry etch systemic conditions of $C_2ClF_5$: 50 sccm, 550 mTorr for one minute.

2. A method of manufacturing a semiconductor device comprising the steps of:
   (a) forming a multilayer mask structure on a semiconductor substrate;
   (b) forming an aperture through a portion of said multilayer mask structure, so as to expose a prescribed region of underlying mask material;
   (c) forming a dielectric spacer along a sidewall portion of the aperture formed in step (b), so as to define a reduced spacing masking window over said underlying mask material;
   (d) etching that portion of said underlying mask material within said reduced spacing masking window;
   (e) forming a further masking layer atop the structure resulting from step (d), so as to fill the etched portion of said underlying mask material with material of said further masking layer; and
   (f) etching underlying mask material adjacent to the filled portion thereof using said further masking layer as a mask, so as to expose said substrate, wherein
   step (e) comprises non-selectively depositing a layer of further masking material atop the structure resulting from step (d), so as to fill the etched portion of said underlying mask with material of said further masking layer and cover said underlying mask material, and etching said layer of further masking material to said underlying masking material, so as to effectively planarize the structure at the level of said underlying masking material, and wherein
   step (a) comprises forming a bilevel mask structure by forming a first resist layer on said substrate and a second resist layer on said first resist layer, and wherein step (b) comprises forming said aperture through said second resist layer to expose a prescribed region of said first resist layer, and wherein
   step (e) includes etching said layer of further masking material to the level of said first resist layer at dry etch systemic conditions of $C_2F_6/CHF_3/He = 50/100/50$ sccm, 550 mTorr and 1675 W.

3. A method of manufacturing a semiconductor device comprising the steps of:
   (a) forming a multilayer mask structure on a semiconductor substrate;
   (b) forming an aperture through a portion of said multilayer mask structure, so as to expose a prescribed region of underlying mask material;
   (c) forming a dielectric spacer along a sidewall portion of the aperture formed in step (b), so as to define a reduced spacing masking window over said underlying mask material; and
   (d) etching that portion of said underlying mask material within said reduced spacing masking window, and wherein
   step (a) comprises forming a bilevel mask structure by forming a first resist layer on said substrate and a second resist layer on said first resist layer, and wherein step (b) comprises forming said aperture through said second resist layer to expose a prescribed region of said first resist layer, and wherein
   step (c) comprises non-selectively forming a layer of dielectric material on the structure resulting from step (b) and thereafter performing a dry etch of said layer of dielectric material to said first resist layer so as to form said dielectric spacer, and wherein
   step (c) comprises performing said dry etch at conditions of $C_2F_6/CHF_3/He = 50/100/50$ sccm, 550 mTorr and 1675 W.

* * * * *